United States Patent
Lee et al.

(10) Patent No.: US 9,456,511 B2
(45) Date of Patent: Sep. 27, 2016

(54) SUPPORT ASSEMBLY FOR A DEVICE

(71) Applicant: Hewlett-Packard Development Company, L.P., Houston, TX (US)

(72) Inventors: Peter K. Lee, Cupertino, CA (US); Jacques Gagne, Los Gatos, CA (US); Raymond L. Gradwohl, Saratoga, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 14/428,956

(22) PCT Filed: Oct. 30, 2012

(86) PCT No.: PCT/US2012/062563
§ 371 (c)(1),
(2) Date: Mar. 17, 2015

(87) PCT Pub. No.: WO2014/070141
PCT Pub. Date: May 8, 2014

(65) Prior Publication Data
US 2015/0250064 A1    Sep. 3, 2015

(51) Int. Cl.
| F16M 11/10 | (2006.01) |
| H05K 5/02 | (2006.01) |
| F16M 11/20 | (2006.01) |
| F16M 11/38 | (2006.01) |
| F16M 11/00 | (2006.01) |

(52) U.S. Cl.
CPC ............ *H05K 5/0204* (2013.01); *F16M 11/10* (2013.01); *F16M 11/2021* (2013.01); *F16M 11/2092* (2013.01); *F16M 11/38* (2013.01); *F16M 11/00* (2013.01); *F16M 2200/044* (2013.01); *F16M 2200/08* (2013.01); *Y10T 29/24* (2015.01)

(58) Field of Classification Search
CPC ............... H05K 5/0204; F16M 11/10; F16M 11/2021; F16M 11/2092; F16M 11/38; F16M 2200/044; F16M 2200/08; Y10T 29/24
USPC ....... 248/372.1, 919–923, 162.1, 125.8, 158, 248/161, 123, 280.11, 284.1, 297.11
See application file for complete search history.

(56) References Cited

U.S. PATENT DOCUMENTS

| 4,768,762 A | 9/1988 | Lund |
| 7,252,277 B2 | 8/2007 | Sweere et al. |
| 7,497,410 B2 * | 3/2009 | Lee ........................ F16M 11/04 248/125.8 |

(Continued)

FOREIGN PATENT DOCUMENTS

| KR | 10-2008-0015607 A | 2/2008 |
| KR | 10-2008-0063685 A | 7/2008 |

(Continued)

OTHER PUBLICATIONS

International Search Report and Written Opinion, International Application No. PCT/US2012/062563, Date of Mailing: Apr. 30, 2013, pp. 1-9.

(Continued)

*Primary Examiner* — Nkeisha Smith
(74) *Attorney, Agent, or Firm* — Trop Pruner & Hu P.C.

(57) ABSTRACT

A support assembly has a base that is pivotable with respect to an arm. A rotatable cam is provided that has a non-circular profile. A biasing assembly is linked to the cam.

9 Claims, 9 Drawing Sheets

(56) References Cited

U.S. PATENT DOCUMENTS

| | | | |
|---|---|---|---|
| 7,567,436 B2 | 7/2009 | Jeong | |
| 7,597,302 B2 * | 10/2009 | Lee | F16M 11/04 248/157 |
| 7,637,463 B2 | 12/2009 | Yen et al. | |
| 7,694,919 B2 | 4/2010 | Lee | |
| 7,828,255 B2 * | 11/2010 | Yen | F16M 11/04 248/123.11 |
| 8,011,632 B2 | 9/2011 | Wang et al. | |
| 8,226,054 B2 * | 7/2012 | Chen | F16M 11/10 16/337 |
| 8,286,927 B2 | 10/2012 | Sweere et al. | |
| 8,570,723 B2 | 10/2013 | Myerchin | |
| 8,576,553 B2 | 11/2013 | Myerchin | |
| 8,672,277 B2 * | 3/2014 | Hsu | F16M 11/10 248/121 |
| 8,967,569 B2 * | 3/2015 | Hsu | F16M 11/10 16/233 |
| 2005/0088808 A1 * | 4/2005 | Michoux | F16M 11/04 361/679.05 |
| 2006/0032998 A1 * | 2/2006 | Depay | F16M 11/10 248/291.1 |
| 2007/0029457 A1 | 2/2007 | Baek | |
| 2007/0262210 A1 * | 11/2007 | Oh | F16M 11/10 248/125.1 |
| 2007/0272809 A1 * | 11/2007 | Jang | F16M 11/04 248/133 |
| 2008/0185497 A1 | 8/2008 | Chen | |
| 2009/0206212 A1 | 8/2009 | Yen et al. | |
| 2010/0084522 A1 | 4/2010 | Zhou et al. | |
| 2013/0112818 A1 * | 5/2013 | Hsu | F16M 11/10 248/121 |
| 2015/0265048 A1 * | 9/2015 | Lindblad | A47B 1/062 248/123.11 |

FOREIGN PATENT DOCUMENTS

| | | |
|---|---|---|
| KR | 2009-0072725 A | 7/2009 |
| TW | M332337 | 5/2008 |
| WO | WO-2005012783 A2 | 2/2005 |

OTHER PUBLICATIONS

PCT Search Report and Written Opinion ~ Application No. PCT/US2012/062563 ~ dated Apr. 30, 2013 ~ 9 pages.

* cited by examiner

SUPPORT ASSEMBLY FOR A DEVICE

BACKGROUND

For user convenience, a display device can be mounted on a support assembly that allows for adjustment of a position of the display device. The support assembly can include multiple members that are pivotably arranged with respect to each other, such that a user can move the display device to a target position. As display devices have increased in size, their weight has also increased correspondingly. As a result, users often find that adjustment of such relatively heavy display devices can be difficult using traditional support assemblies.

BRIEF DESCRIPTION OF THE DRAWINGS

Some embodiments are described with respect to the following figures.

DETAILED DESCRIPTION

Figure 1:
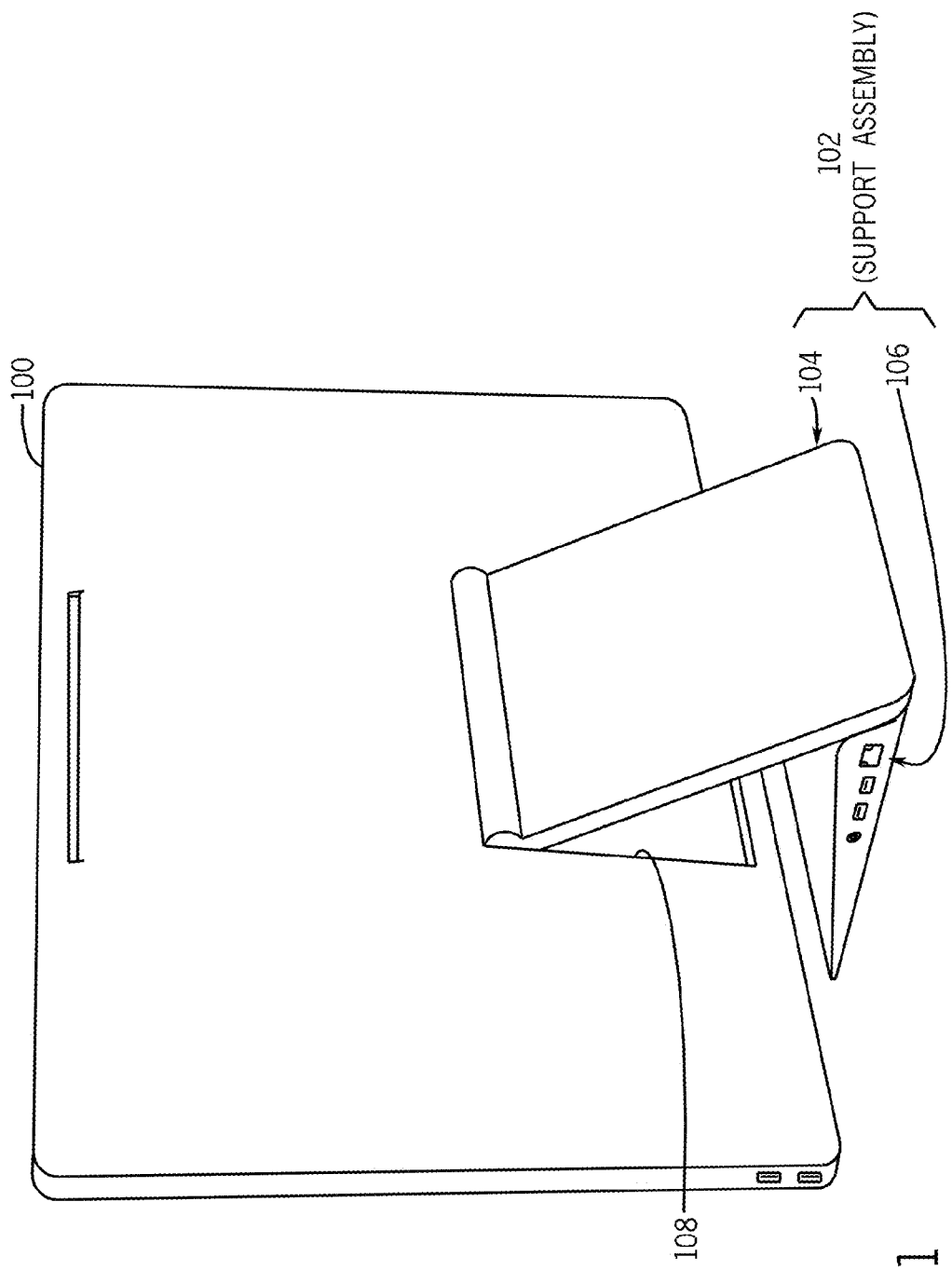
FIG. 1 is a rear perspective view of an arrangement that includes a display device and a support assembly according to some implementations.

FIG. 1 illustrates an example arrangement that includes a display device 100 that is supported by a support assembly 102 according to some implementations. In FIG. 1, the rear of the display device 100 is shown. The support assembly 102 has an arm 104 pivotably connected to the rear of the display device 100. The support assembly 102 further includes a base 106, which can sit on a support surface (e.g. surface of a table or other furniture or other structure). The arm 104 is pivotably mounted with respect to the base 106, such that the arm 104 can rotatably pivot with respect to the base 106. As further depicted in FIG. 1, a recess 108 is formed in the rear of the display device 100 to receive a part of the arm 104 when the display device 100 is pivoted such that the display device 100 collapses towards the arm 104. A user can adjust the position of the display 100 by gripping the display device 100 and moving the display device 100 to a target position. The movement of the display device 100 can cause relative pivoting between the display device 100 and the arm 104, and between the arm 104 and the base 106.

Although reference is made to a display device in some examples, it is noted that a support assembly according to some implementations can also be used for supporting other types of devices, such as computers, tablets, appliances, furniture, industrial equipment, all-in-one computers, and so forth. Note that various electronic components of any of the foregoing devices can be included in any one or some combination of the following: display device 100, arm 104, and base 106.

As display devices have increased in size, their weight has increased correspondingly. As a result, with traditional support assemblies, a user may find it difficult to move the display device 100. In some cases, traditional support assemblies may rely upon relatively large frictional forces between moveable members in the support assembly to support the weight of a display device. In such support assemblies, a user may have to expend a relatively large force when attempting to adjust a position of the display device. Moreover, the articulation of the pivotable members of a traditional support assembly may not be smooth, which can lead to abrupt movement of the display device during position adjustment.

In accordance with some implementations, the support assembly 102 according to some implementations provides for smooth articulation through a relatively wide range of rotating angles between the arm 104 and base 106 of the support assembly 102. The adjustment of the support assembly 102 can be accomplished by application of relatively small, even force by a user. As discussed further below, the provision of one or multiple biasing elements in the support assembly 102, in combination with use of a rotatable cam mechanism, allows for the smooth articulation of the arm 104 relative to the base 106.

Figure 2:
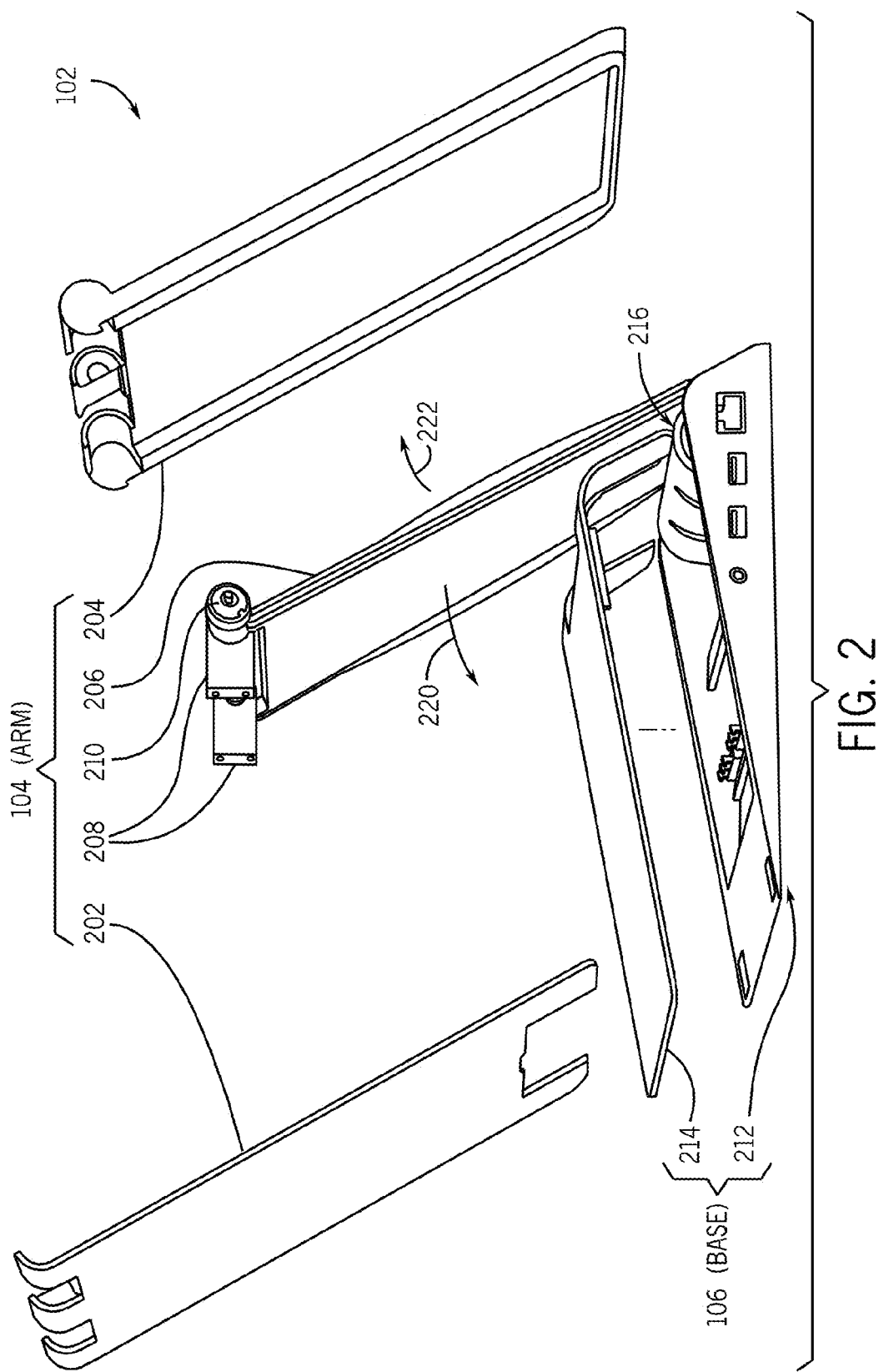
FIG. 2 is a side, exploded perspective view of a support assembly according to some implementations.

FIG. 2 is an exploded side view of the support assembly 102, where a front arm cover 202 and a rear arm cover 204 are depicted as being disengaged from an arm support member 206. The arm support member 206 is pivotably attached to display support members 208 on a hinge mechanism 210. Collectively, items 202, 204, 206, 208, and 210 are part of the arm 104.

The display support members 208 are attached to the rear of the display device 100 depicted in FIG. 1, such as by use of screws or other attachment mechanisms. The hinge mechanism 210 allows the display support members 208 to pivot with respect to the arm support member 206. In this manner, a user can pivotably adjust the position of the display device 100 relative to the arm 104.

The arm 104 is further pivotably attached to the base 106 through a hinge assembly 216, which has a base support structure 212 and an upper base cover 214. In FIG. 2, the upper base cover 214 is detached from the base support structure 212 to illustrate a portion of components inside the base support structure 212. A portion of the hinge assembly 216 is depicted as being part of the base support structure 212. The hinge assembly 216 pivotably couples the arm 104 to the base 106, as discussed in further detail below.

As further shown in FIG. 2, an arrow 220 depicts a direction of rotation of the arm support member 206 towards the base 106. Movement of the arm support member 206 along direction 220 refers to collapsing the arm support member 206 towards the base 106. Another arrow 222 depicts rotation of the arm support member 206 away from the base 106.

Figure 3:
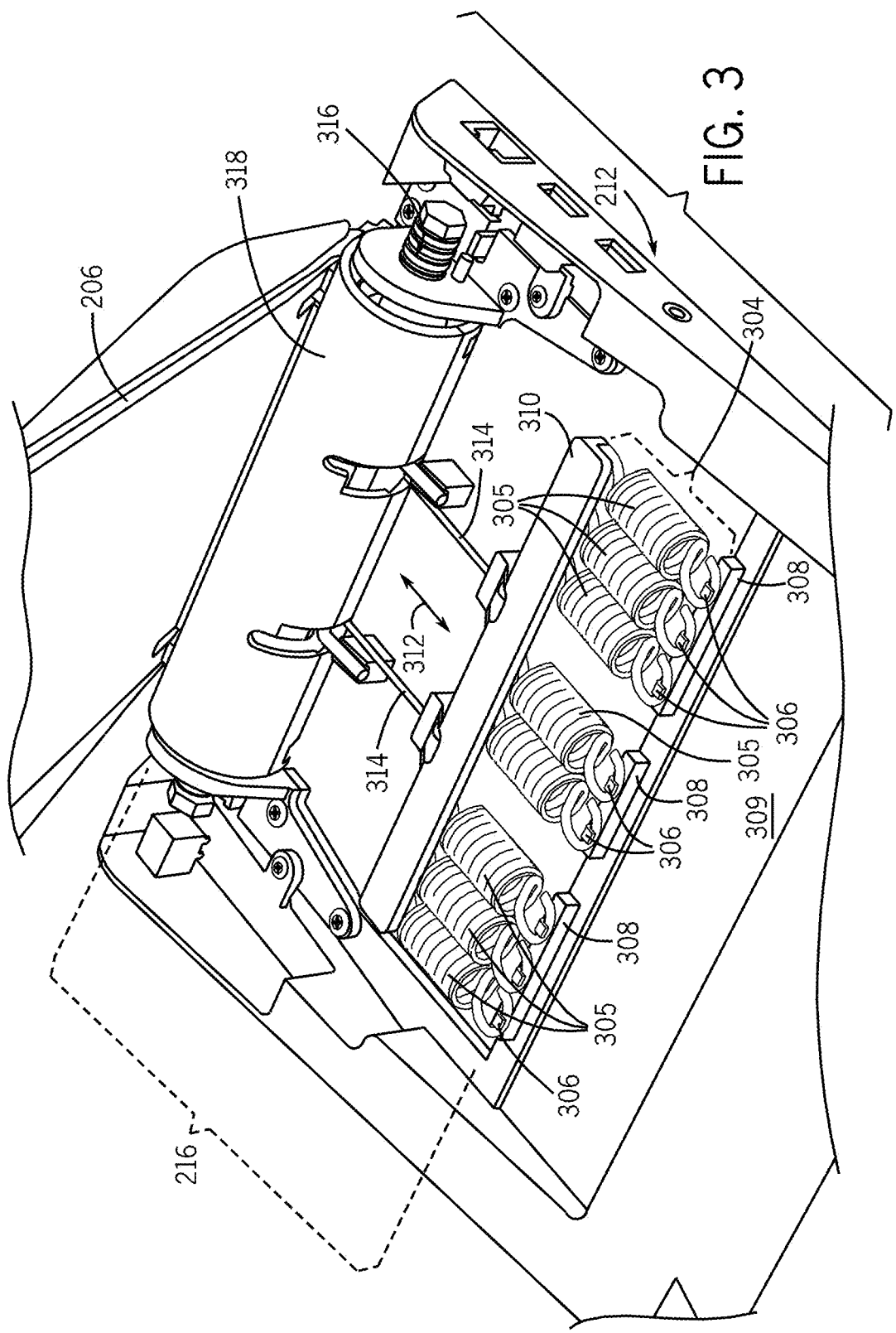
FIG. 3 is a top perspective view of a hinge assembly that is part of the support assembly according to some implementations.

FIG. 3 is a top perspective view of the hinge assembly 216 that is provided in an inner chamber defined inside the base support structure 212. Note that the upper base cover 214 (FIG. 2) has been removed in the view of FIG. 3.

The hinge assembly 216 includes a biasing assembly 304, which can include a number of linear tension springs 305 in some implementations. Although an example number of springs 305 are depicted as being part of the biasing assembly 304, it is noted that in other implementations, a different number of springs 305 can be employed, where the different number can be one or greater. Also, even though the biasing assembly 304 is depicted as being part of the base support structure 212 in FIG. 3, the biasing assembly 304 can alternatively be provided as part of the arm 104 in other implementations.

Moreover, in other implementations, the biasing assembly 304 can be of a different type, such as a piston assembly where unequal pressure provided on different sides of a piston provides for a biasing force to be applied.

First ends of the springs 305 are attached to hooks 306 connected to support features 308 formed on a surface 309 provided by the base support structure 212. Second ends of the springs 305 are connected to a moveable longitudinal bar 310, which is linearly movable back and forth along direction 312.

As further depicted in FIG. 3, the bar 310 is connected to links 314. In some implementations, the links 314 are cables. The cables 314 interconnect the bar 310 to a rotatable cam inside a hinge 316. A portion of the hinge 316 is partially covered by a hinge cover 318.

The linear springs 305 are configured to apply a biasing force that tends to bias the arm support member 206 away from the base support structure 212. Collapsing the arm support member 206 towards the base support structure 212 opposes the biasing force applied by the linear springs 305, as applied through the cables 314 to the hinge 316.

Movement of the bar 310 away from the hinge 316 (along direction 312) causes the arm support member 206 to rotate away from the base support structure 212. On the other hand, movement of the bar 310 towards the hinge 316 occurs when the arm support member 206 collapses towards the base support structure 212.

Figure 4:
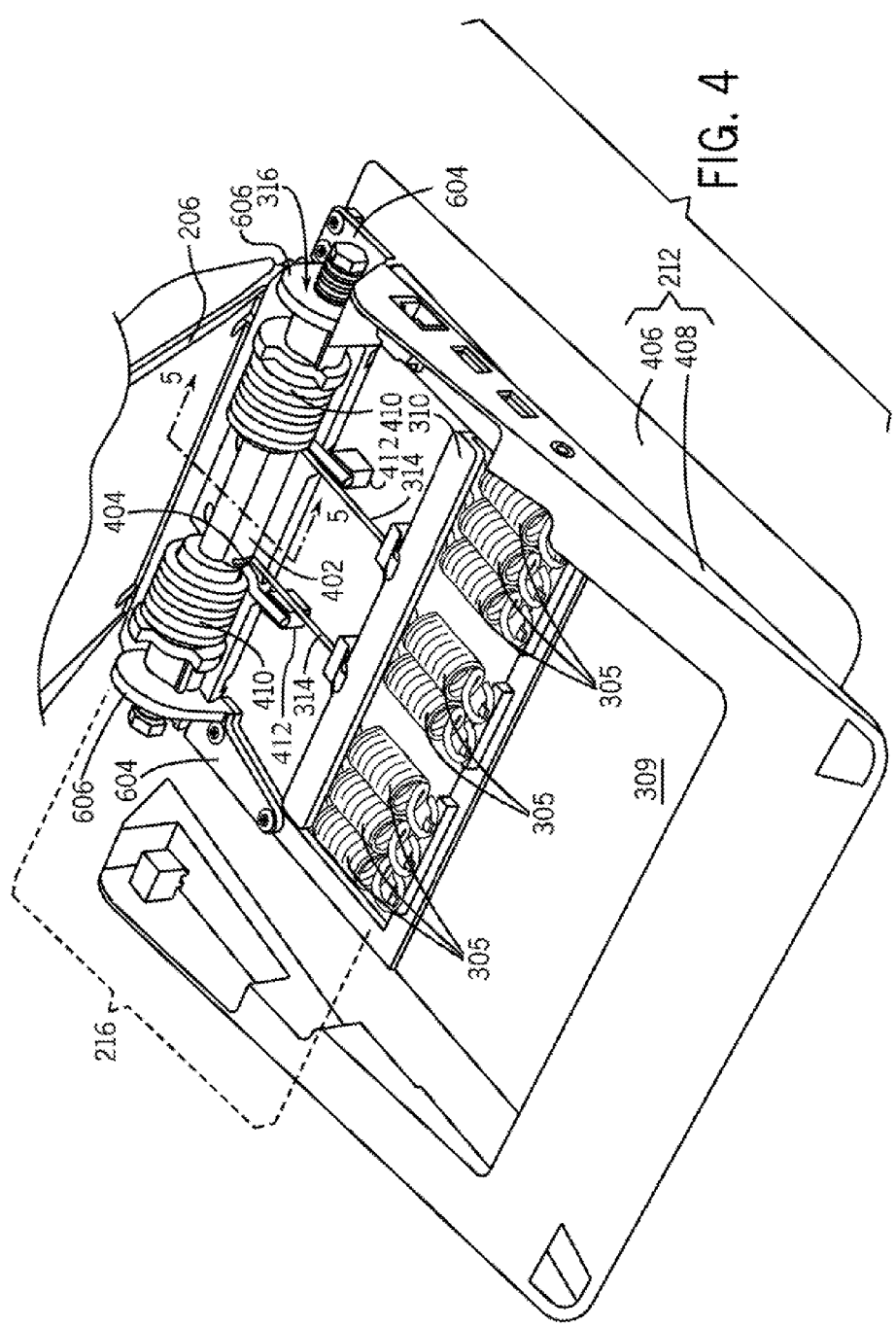
FIG. 4 is another top perspective view of the hinge assembly with a hinge cover removed, in accordance with some implementations.

The hinge cover 318 of FIG. 3 is removed in the view of FIG. 4, which shows a rotatable cam 402 that is part of the hinge 316. In the view of FIG. 4, a bottom base cover 408 is detached from a base plate 406. The base plate 406 and the bottom base cover 408 form the base support structure 212.

The rotatable cam 402 has grooves 404 to receive the corresponding cables 314. As the cam 402 is rotated due to relative pivoting motion of the arm support member 206 and the base plate 406, the cables 314 are received into the respective grooves 404 of the cam 402. As a result, at least a portion of each cable 314 is wound onto the cam 402 as the cam 402 rotates.

As further depicted in FIG. 4, in accordance with some implementations, torsional strings 410 are provided in the hinge 316 to apply a biasing force. One end of each of the torsional springs 410 is supported by a corresponding torsional spring support structure 412 provided on the surface 309. In other examples, other types of torsional biasing elements can be provided. The torsional springs 410 work in conjunction with the linear springs 305 to bias the arm support member 206 away from the base plate 406. The collective biasing force of the linear springs 305 and torsional springs 410 help support the weight of the display device 100 of FIG. 1. To collapse the display device 100 downwardly, a user can simply apply a downward force on the display device 100 to collapse the arm 104 of FIG. 1 towards the base 106, which opposes the biasing force applied by the springs 305 and 410.

Figure 5:
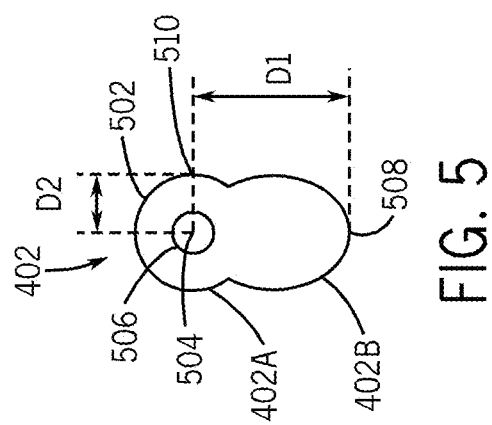
FIG. 5 is a cross-sectional view of a rotatable cam according to some implementations.

FIG. 5 shows a cross-sectional profile 502 of the cam 402, taken along section 5-5 in FIG. 4. As depicted in FIG. 5, the cross-sectional profile 502 of the cam 402 is non-circular. The cam 402 is rotatable about an axis represented by 504, which is at the center of a through-hole 506 of the cam 402. A mounting pin (shown in FIG. 6) is passed through the through-hole 506, and the cam 402 can rotate with respect to the mounting pin.

The cam 402 has a first portion 402A and a second portion 402B that is integrally formed with the first portion 402A. The first portion 402A has a semi-circular profile. The second portion 402B also has an arc-shaped profile. Collectively, the cam portions 402A and 402B form a general figure-8 shape, which provides the non-circular cross-sectional profile 502. In other examples, the cam 402 can have other non-circular cross-sectional profiles, such as an oval profile, a polygonal profile, and so forth.

Due to the non-circular cross-sectional profile 502 of the cam 402, a distance D1 between the axis 504 and a first outer edge 508 of the cam 402 is different from a second distance D2 between the axis 504 and a second outer edge 510 of the cam 402. The distance D1 extends along a first direction of the cam 402, while the distance D2 extends along a second direction of the cam 402, where the second direction is generally perpendicular to the first direction.

The non-circular cross-sectional profile of the cam 402 causes the cam 402 to provide a non-linear response to a linear force applied by the linear springs 305, as the cam 402 is rotated and as portions of the cable 314 are wound onto the cam 402. Consequently, the amount of elongation of the springs 305 caused by a rotation of the cam 502 varies as a function of angle of the cam rotation. Thus, the torque applied on the cam 402 by the linear springs 305 (and the torsional spring 410) varies non-linearly as a result of cam rotation angle.

Figure 6:
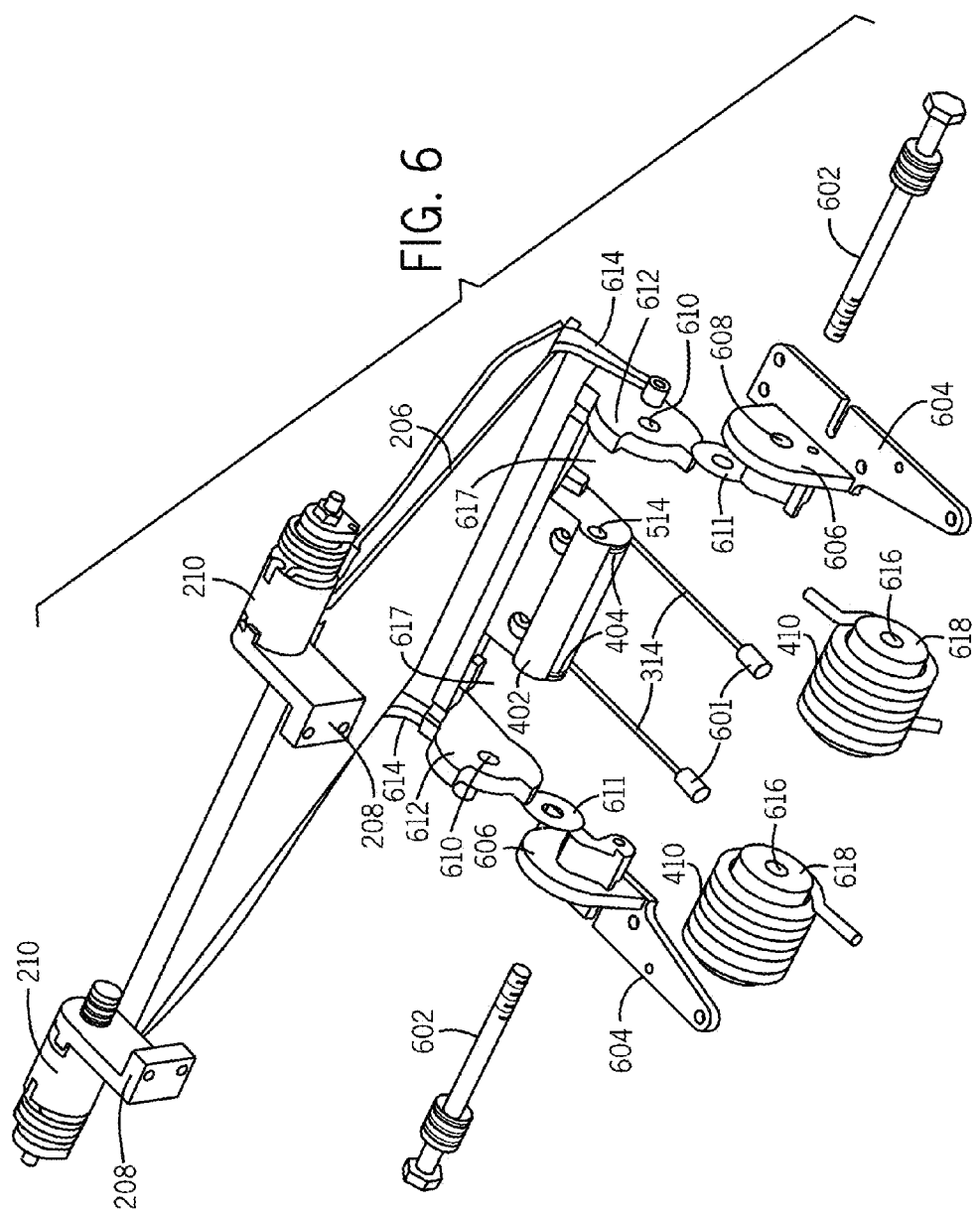
FIG. 6 is an exploded view of some components of the support assembly, in accordance with some implementations.

FIG. 6 is an exploded view of portions of the support assembly 102. Base hinge mount structures 604 (also shown in FIG. 4) are attached to the base plate 406 depicted in FIG. 4. The base hinge mount structures 604 have flange members 606 with openings 608 that are to be aligned with respective openings 610 of a hinge connector structure 612. A washer 611 is provided between each pair of the base hinge mount structure 604 and hinge connector structure 612. The hinge connector structures 612 are attached by respective connector members 614 to the arm support member 206.

Mounting pins 602 are arranged to extend through the aligned openings 608 and 610 of the respective base hinge mount structures 604 and hinge connector structures 612. The mounting pins 602 also pass through respective openings 616 of torsional ring support members 618 to engage with the through-hole 514 of the cam 402. The torsional ring support members 618 are generally cylindrical in shape, and are designed to hold the respective torsional springs 410, as depicted. The torsional ring support members 618 are arranged to be provided in respective regions 617 inside the hinge connector structures 612. In this way, the openings 616 of the torsional ring support members 618 can align with respective openings 610 of the hinge connector structures 612.

The cam 402 is pivotable or rotatable about the mounting pins 602. Pivoting of the cam 402 results in corresponding pivoting of the hinge connector structures 612, which are connected to the arm support member 206. As a result, pivoting of the cam 402 results in corresponding pivoting of the arm support member 206.

As further shown in FIG. 6, the cables 314 have respective first connection ends 601 which are configured for connection to the moveable bar 310 of FIG. 3.

Figure 7:
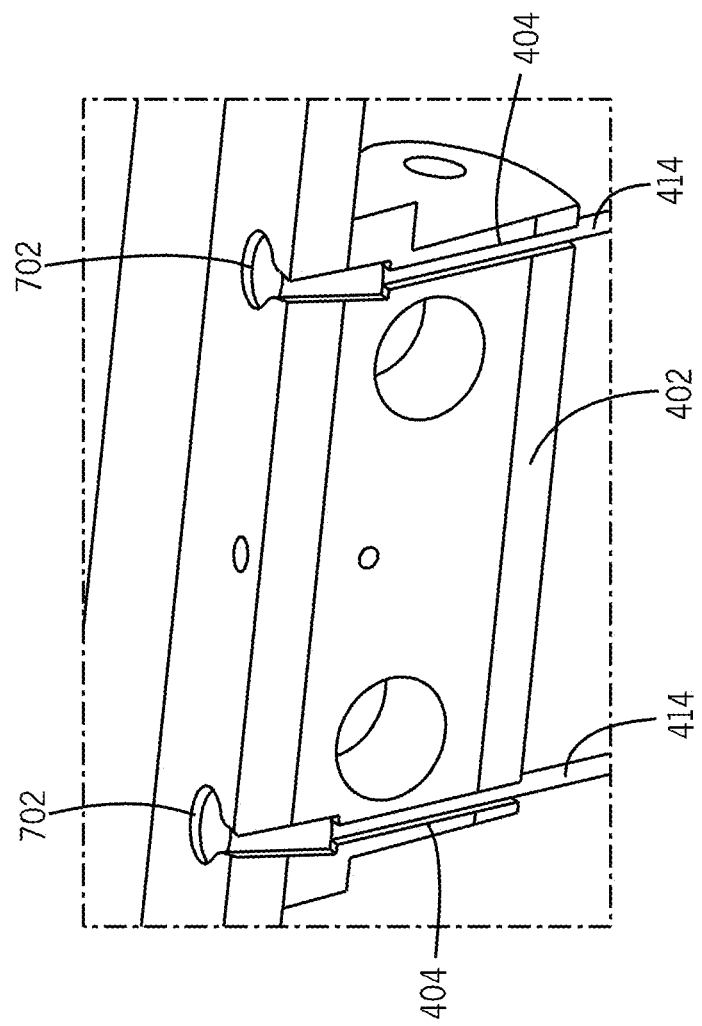
FIG. 7 is a rear view of a cam according to some implementations.

A rear view of a backside of the cam 402 is depicted in FIG. 7. FIG. 7 shows the grooves 404 of the cam 402 extending to the rear side of the cam 404, with the cables 314 extending along the grooves 404. Second connection ends (similar to first connection ends 601 in FIG. 6) of the cables 314 are engaged in respective connection slots 702 of the cam 402.

Figure 8:
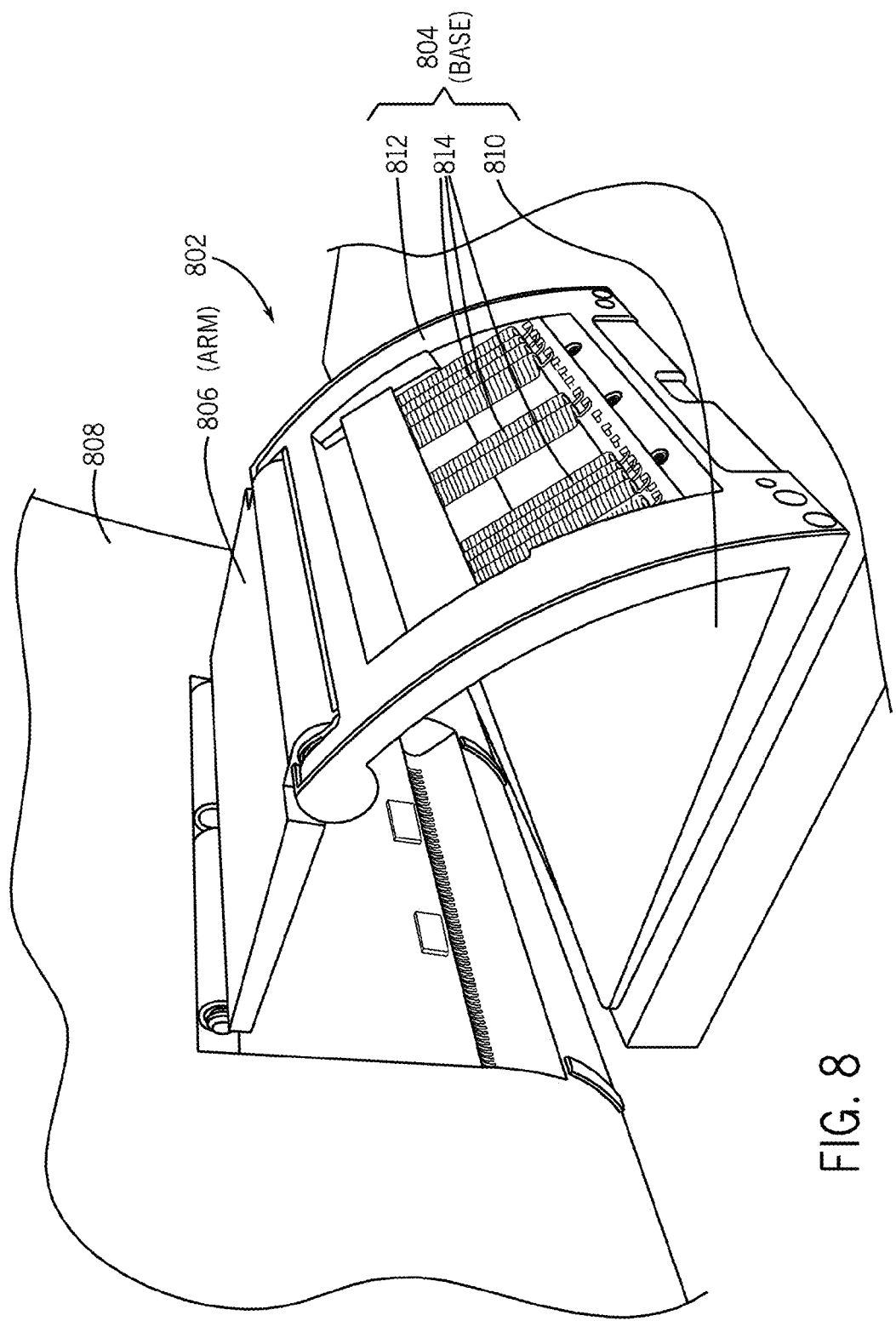
FIG. 8 is a rear perspective view of a display device and a support assembly according to alternative implementations.

FIG. 8 illustrates a support assembly 802 according to alternative implementations. The support assembly 802 includes a base 804 that is pivotably attached to an arm 806. The arm 806 in turn is pivotably attached to a display device 808. The base 804 has a stand 810 and a generally arc-shaped base extension 812 that is pivotably attached to the arm 806. A rear cover (not shown) of the base extension 812 has been removed to show linear tension springs 814 provided in the base extension 812. The linear springs 814 are provided to apply a biasing force, similar to that provided by the linear springs 305 of FIG. 4. In other implementations, the linear springs 814 can be provided in the arm 806 instead of the base 804.

Figure 9:
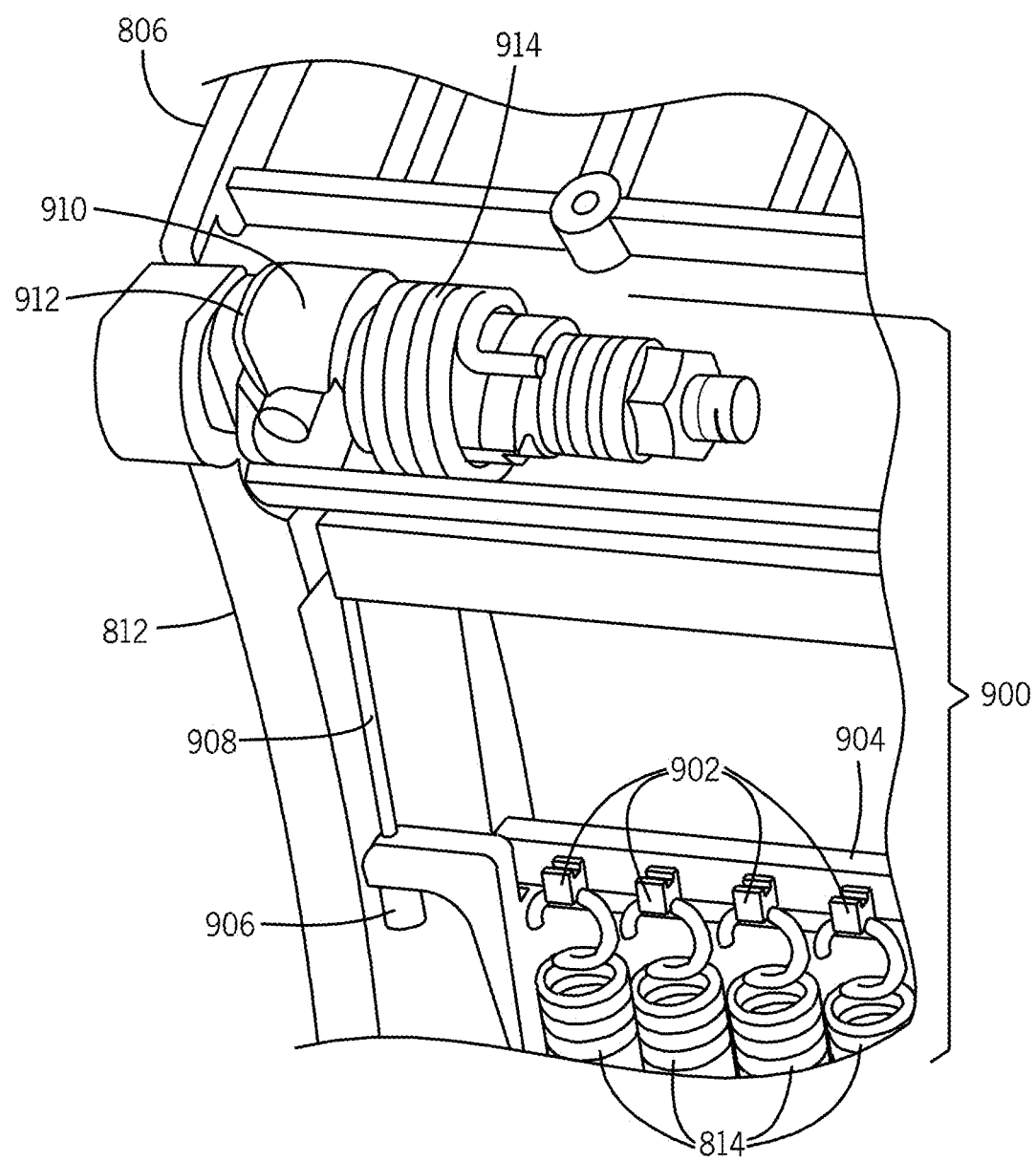
FIG. 9 is a rear perspective view of a portion of the support assembly of FIG. 8 according to alternative implementations.

A hinge assembly 900 for pivoting attachment of the base extension 812 and the arm 806 is illustrated in FIG. 9. The linear springs 814 are attached to hooks 902 of a movable member 904. Additionally, a first connection end 906 of a cable 908 is connected to the movable member 904. Although not shown, a similar cable is provided on the other side to connect to another side of the movable member 904.

The cable 908 extends upwardly to a rotatable cam 910, which has a non-circular cross-sectional profile. The cable 908 extends in a groove 912 provided in the cam 910. A second connection end 912 of the cable 908 is engaged with the cam 910. As further depicted in FIG. 9, a torsional spring 914 is provided at the hinge, where the torsional spring 914 provides functionality similar to that of a torsional spring 410 shown in FIG. 4. Although just one torsional spring and one cam 910 is depicted in FIG. 9, it is noted that another torsional spring 914 and another cam 910 are provided on the other side of the hinge assembly 900.

Similar to the operation of the support assembly 102 discussed in connection with FIGS. 1-7, the linear springs 814 and torsional springs 914 of the support assembly 802 apply a biasing force to support the weight of the display device 808. Adjustment of the position of the display device 808 causes rotation of the cams 910 and corresponding movement of the moveable member 904. Due to the non-circular cross-sectional profile of the cams 910, a non-linear response is provided by rotation of the cam 910 to the linear force applied by the linear springs 814. In this way, smooth articulation of the display device 808 can be accomplished across a relatively wide range of rotation angles, similar to that provided by the support assembly 102 discussed above.

Figure 10:
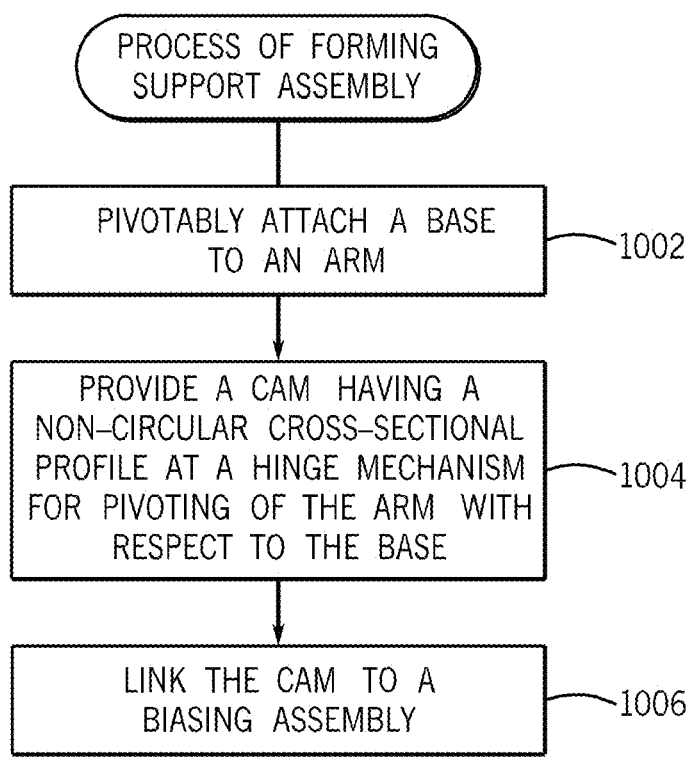
FIG. 10 is a flow diagram of a process of forming a support assembly according to some implementations.

FIG. 10 is a flow diagram of a process of forming a support assembly according to some implementations, such as the support assembly 102 or 802 discussed above. The process includes pivotably attaching (at 1002) a base to an arm that is for attachment to a device, such as a display device. The process further includes providing (at 1004) a cam with a non-circular cross-sectional profile at a hinge that allows for pivoting of the arm with respect to the base. Additionally, the process links (at 1006) the cam to a biasing assembly using a link having a portion that is windable on the non-circular cross-sectional profile of the cam.

The following describes example operation of an arrangement as depicted in FIGS. 1-4. A user can grip the display device 100 (FIG. 1) to move the display device 100. If the user applies a force to cause the arm 104 to collapse towards the base 106 (such as to move the display device 100 downwardly), then that applied force opposes the collective biasing force of the linear springs 305 and torsional springs 410 (FIG. 4) that help support the weight of the display device 100. Collapsing the arm 104 towards the base 106 causes counter-clockwise rotation of the rotatable cam 402 (FIG. 4), which winds the cables 314 (FIG. 4) onto the cam 402 to pull the bar 310 towards the hinge 316, which extends the linear springs 305.

In contrast, if the user applies a force to cause the arm 104 to be moved away from the base 106 (such as to lift the display device 100), then this lifting force is aided by the collective biasing force of the linear springs 305 and torsional springs 410. Moving the arm 104 away from the base 106 causes clockwise rotation of the cam 402, which allows the bar 310 to move away from the hinge 316 and allows contraction of the linear springs 305.

In the foregoing description, numerous details are set forth to provide an understanding of the subject disclosed herein. However, implementations may be practiced without some or all of these details. Other implementations may include modifications and variations from the details discussed above. It is intended that the appended claims cover such modifications and variations.

What is claimed is:

1. A support assembly to movably support a device, comprising:
   a base;
   an arm; and
   a hinge assembly to pivotably couple the arm to the base, wherein the hinge assembly comprises:
      a rotatable cam having a non-circular profile;
      a link attached to the rotatable cam, wherein a portion of the link is windable about the non-circular profile of the cam as the cam rotates, wherein the cam has a groove to receive the portion of the link as the cam rotates, and wherein the link comprises a cable; and
      a biasing assembly attached to the link to apply to biasing force on the link.

2. The support assembly of claim 1, wherein the cam is rotatable about an axis, wherein the non-circular profile is a non-circular cross-sectional profile of the cam, wherein a first distance between the axis and a first outer edge of the non-circular cross-sectional profile is different from a second distance between the axis and a second outer edge of the non-circular cross-sectional profile.

3. The support assembly of claim 2, wherein the non-circular cross-sectional profile of the cam causes the cam, as the cam rotates, to provide a non-linear response to a linear force applied by the biasing assembly.

4. The support assembly of claim 1, wherein the hinge assembly further comprises a linearly moveable member that is attached between the link and the biasing assembly.

5. The support assembly of claim 1, wherein the biasing assembly comprises a linear spring.

6. The support assembly of claim 5, wherein the hinge assembly further comprises a mounting pin on which the cam is mounted, and a torsional spring mounted on the pin to apply a biasing force in conjunction with a biasing force applied by the linear spring.

7. The support assembly of claim 1, wherein the arm has a hinge to pivotably attach to the device.

8. A support assembly to movably support a device, comprising:
   a base;

an arm; and a hinge assembly to pivotably couple the arm to the base, wherein the hinge assembly comprises:

a rotatable cam having a non-circular cross-sectional profile;

a mounting pin on which the rotatable cam is mounted to allow for rotation of the cam; and cables connecting the cam to a biasing assembly having linear springs, wherein a portion of each of the cables is windable about the non-circular cross-sectional profile of the cam as the cam rotates, wherein rotation of the cam provides a non-linear response to the linear force applied by the linear springs of the biasing assembly.

9. The support assembly of claim 8, wherein the cam is rotatable about an axis, wherein a first distance between the axis and a first outer edge of the non-circular cross-sectional profile is different from a second distance between the axis and a second outer edge of the non-circular cross-sectional profile, wherein the first and second distances extend in corresponding directions that are generally perpendicular to each other.

\* \* \* \* \*